(12) United States Patent
Tao et al.

(10) Patent No.: US 7,693,691 B1
(45) Date of Patent: Apr. 6, 2010

(54) SYSTEMS AND METHODS FOR SIMULATING LINK PERFORMANCE

(75) Inventors: Yuming Tao, Kanata (CA); William W. Bereza, Nepean (CA); Rakesh H. Patel, Cupertino, CA (US); Tad Kwasniewski, Ottawa (CA); Sergey Shumarayev, San Leandro, CA (US); Shoujun Wang, Kanata (CA); Miao Li, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 783 days.

(21) Appl. No.: 11/524,012

(22) Filed: Sep. 19, 2006

Related U.S. Application Data

(60) Provisional application No. 60/764,461, filed on Feb. 1, 2006.

(51) Int. Cl.
*G06F 17/50* (2006.01)
*H04B 1/04* (2006.01)

(52) U.S. Cl. .................. 703/2; 703/6; 703/13; 703/17; 375/267; 398/189

(58) Field of Classification Search .................. 703/2, 703/6, 13, 14, 17; 398/135, 189
See application file for complete search history.

(56) References Cited

U.S. PATENT DOCUMENTS 6,606,588 B1 * 8/2003 Schaumont et al. ............ 703/15
2003/0216901 A1 * 11/2003 Schaumont et al. ............ 703/13
2006/0013328 A1 * 1/2006 Zhang et al. .................. 375/267
2006/0245757 A1 * 11/2006 Elahmadi et al. ............. 398/135
2006/0245758 A1 * 11/2006 Elahmadi et al. ............. 398/135
2006/0245765 A1 * 11/2006 Elahmadi et al. ............. 398/189

OTHER PUBLICATIONS

M. Li et al., "FIR Filter Optimization as Pre-Emphasis of High-Speed Backplane Data Transmission," 2004 International Conference on Communications, Circuits and Systems, vol. II: Signal Processing, Circuits and Systems, International Conference Center, UESTC, Chengdu, China, Jun. 27-29, 2004, pp. 773-776.

M. Li et al., "Studies on FIR Filter Pre-Emphasis for High-Speed Backplane Data Transmission," GSPx Technical Conference, Sep. 27-30, 2004, Santa Clara, CA.

Y. Tao et al., "A Signal Integrity-Based Link Performance Simulation Platform," Proceedings of the IEEE 2005 Custom Integrated Circuits Conference, Sep. 18-21, 2005, pp. 725-728.

* cited by examiner

*Primary Examiner*—Thai Phan
(74) *Attorney, Agent, or Firm*—Ropes & Gray LLP; Robert R. Jackson

(57) ABSTRACT

Systems and methods for accurately and quickly simulating link performance of a transceiver operating with any given transmission medium are provided. Accurate and quick link simulations may be provided using a link simulation platform. The link simulation platform may simulate link performance using transceiver behavioral models (e.g., transmitter and receiver behavioral models) that incorporate silicon level parameters, which parameters enable the behavioral models to substantially emulate the actual behavior of the transceiver portions of the link.

33 Claims, 16 Drawing Sheets

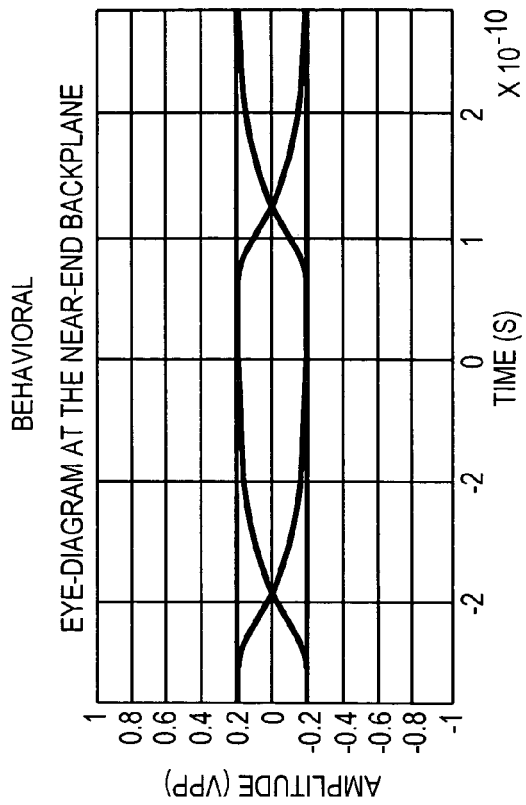
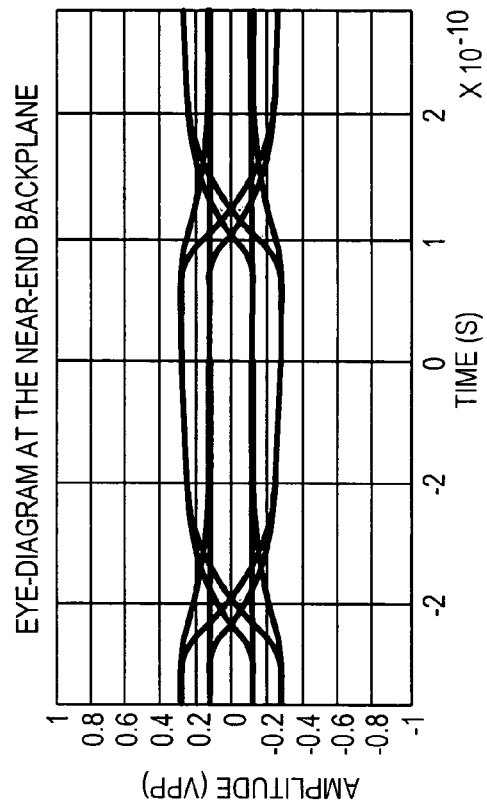
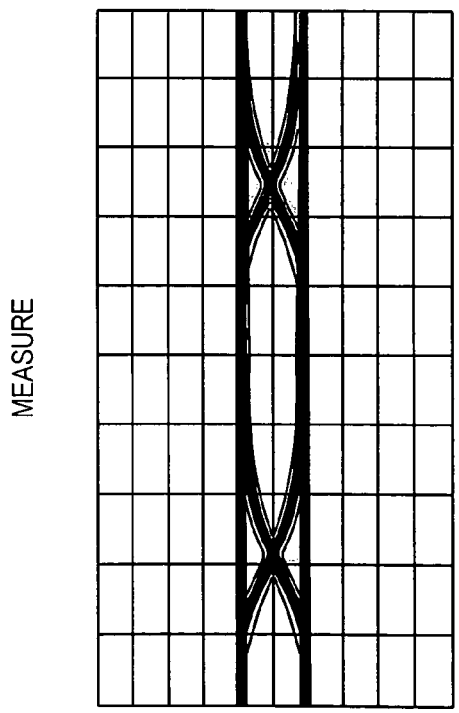
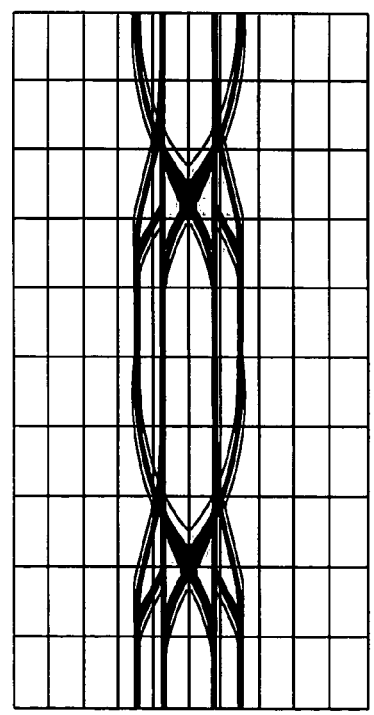
FIG. 7A
FIG. 7B

FIG. 13

| CH FEATURES | TYCO TR2 56" FR4 BP @ 6.5Gb/s ||||||||||
|---|---|---|---|---|---|---|---|---|---|---|
| | TOP COUNTER-BORED; AC-COUPLED |||||||||| 
| EQ/PRE-EMP | 0 | 3.5dB | 4.4dB | 5.4dB | 6.3dB | 7.3dB | 8.4dB | 9.5dB |
| 0 | X | X | X | X | X | X | X | X |
| 1 | X | X | X | X | X | X | X | X |
| 2 | X | X | X | X | X | X | X | X |
| 3 | X | X | X | X | X | X | X | X |
| 4 | X | X | X | X | X | X | X | X |
| 5 | X | X | X | X | X | X | X | X |
| 6 | X | X | X | X | O | X | O | O |
| 7 | X | X | X | X | X | O | X | O |
| 8 | X | O | O | O | O | O | O | X |
| 9 | X | X | X | O | O | O | O | O |
| 10 | X | O | O | O | O | O | O | O |
| 11 | X | X | O | O | O | O | O | O |
| 12 | X | O | X | X | X | X | X | X |
| 13 | X | X | O | O | O | O | O | O |
| 14 | X | X | O | X | X | O | O | O |
| 15 | X | X | X | X | X | O | O | O |

X BIT ERROR
O ERROR FREE

SYSTEMS AND METHODS FOR SIMULATING LINK PERFORMANCE

This application claims the benefit of U.S. Provisional Application No. 60/764,461, filed Feb. 1, 2006, the disclosure of which is hereby incorporated by reference herein in its entirety.

BACKGROUND OF THE DISCLOSURE

The present disclosure relates to high-speed serial interface links, and more particularly to systems and methods for providing behavior models of such links.

HSSI (high-speed serial interface) applications are well known. Such applications include high-speed transceivers and have been adopted for use in chip-to-chip, board-to-board, backplane, box-to-box, and other designs. In general, a HSSI application or HSSI transceiver includes a transmitter portion, a transmission medium, a receiver portion, and associated circuitry that may support transmission and reception of signals (e.g., clock data recovery circuitry). The transmitter and receiver portions, the transmission medium, and associated circuitry may collectively be referred to herein as a link. The transmission portion may provide data to the receiver portion via the transmission medium at a predetermined data rate. As data rates have increased and continue to increase (up to 10 Gb/s and beyond), HSSI transceivers have become and continue to increase in complexity—to preserve or maintain a certain level of signal integrity. For example, it is desirable to minimize or prevent the occurrence of bit errors in the transmission of data through a link. The occurrence of a bit errors may be quantified as a bit-error-ratio (BER). BER may be influenced by several factors most notably random noise that causes random jitter (RJ) several sources of deterministic jitter (DJ)—inter-symbol-interference (ISI) often being the most dominant contributor, as well as other sources such as cross-talk.

ISI may limit the maximum distance and bit rate carrying capacity of a transmission medium (e.g., a backplane). ISI may be caused by channel impairments such as amplitude attenuation and group delay distortion. In order to compensate for ISI, transceivers may be constructed to have a number of pre-emphasis and/or equalization settings. Optimizing these settings to obtain the best transceiver performance is necessary to maximize link performance for any given link or backplane. Doing so, without aid of link simulation tools, can be time consuming and difficult. Several tools exist, but each is beset with limitations.

Hspice (or other spice-like circuit solvers) is a known tool that may be used to simulate link performance. While Hspice may provide highly accurate silicon level link simulations, a disadvantage of using Hspice to perform a link simulation is that the time required for Hspice to perform a single simulation of a link may take hours or days, depending on the extensiveness of various parameters (e.g., pre-emphasis and equalization settings, transmission mediums, signal characteristics) used. This is because Hspice performs electrical circuit analysis (e.g., current and voltage calculations) when rendering simulations of the link. In addition, the time it takes for an experienced engineer to configure a circuit model and simulation setup may also require an unacceptable period of time. Other tools such as board design tools may exist that provide proprietary models. However, known board design tools do not support link simulations, and are limited to board design. One example is device modeling language (DML) model in Cadence Allegro design environment.

Another known tool is StatEye, which uses MATLAB, to support compliance testing of differential backplane channels. StatEye includes parameterized models for transmitter and receiver and channel function but is not able to incorporate silicon device models with any ease. Furthermore, StatEye also inputs spectral information of sorts that may not accurately reflect what is actually driven in the lab such as certain pseudo-random-sequence (PRBS) or fixed-patterns. Therefore, Stateye may not be able to produce simulation results which accurately correlate to results that would be obtained on an actual link.

What is needed is a tool that accurately and quickly simulates link performance of a transceiver operating with any given transmission medium.

SUMMARY OF THE DISCLOSURE

Systems and methods for accurately and quickly simulating link performance of a transceiver operating with any given transmission medium are provided. Accurate and quick link simulations may be provided using a link simulation platform in accordance with the principles of the present invention. The link simulation platform may simulate link performance using transceiver behavioral models (e.g., transmitter and receiver behavioral models) that incorporate silicon level parameters, which parameters enable the behavioral models to substantially emulate the actual behavior of the transceiver portions of the link. Silicon level parameters, as defined herein, refer to parameters that succinctly characterize a component or components (e.g., a transmitter) of an actual link at the silicon level. To provide a frame of reference of what is meant by silicon level, those of skill in art will appreciate that silicon level parameters includes transistor level characteristics. Thus, silicon level parameters may include, but are not limited to, parameters that influence the operation of transistors such as switching behavior, parasitics expressly associated with a transistor (e.g., gate capacitance) and interconnection parasitics (e.g., routing on a die), loading conditions, transistor charge-sharing effect, electrostatic discharge, bump pad, trace routing terminations, etc. In other words, silicon parameters may include any and all parameters needed to model silicon behavior of a device.

The behavioral models, as well as other modeled aspects of the link (e.g., transmission medium), are mathematical constructs created using, for example, conventional software programs (e.g., Matlab) or programming languages (e.g., C). As such, the link simulation platform uses signal processing calculations to simulate link performance. Signal processing calculations are generally less-processing-power intensive than electrical circuit calculations and thus generates simulation results much faster than known silicon level simulation tools (e.g., Hspice). While there is a trade off between speed and accuracy using signal processing calculations, generally where increases in speed come at the expense of accuracy, the tradeoff in accuracy costs is mitigated by using the behavior models incorporate silicon level parameters according to the invention. As such, the link simulation platform according to the invention provides an optimal blend of speed realized by single processing and accuracy typically only realized in electrical circuit calculations.

BRIEF DESCRIPTION OF THE DRAWINGS

The above and other features of the present invention, its nature and various advantages will be more apparent upon consideration of the following detailed description, taken in conjunction with the accompanying drawings, in which like reference characters refer to like parts throughout, and in which:

FIGS. 7A and 7B show eye-diagrams comparing transmitter output at the near end of the actual transmitter and the behavior transmitter model according to an embodiment of the present invention;

FIG. 13 shows a map of the actual occurrence or non-occurrence of a bit error for each combination of pre-emphasis and equalization settings;

DETAILED DISCUSSION OF THE DISCLOSURE

Figure 1:
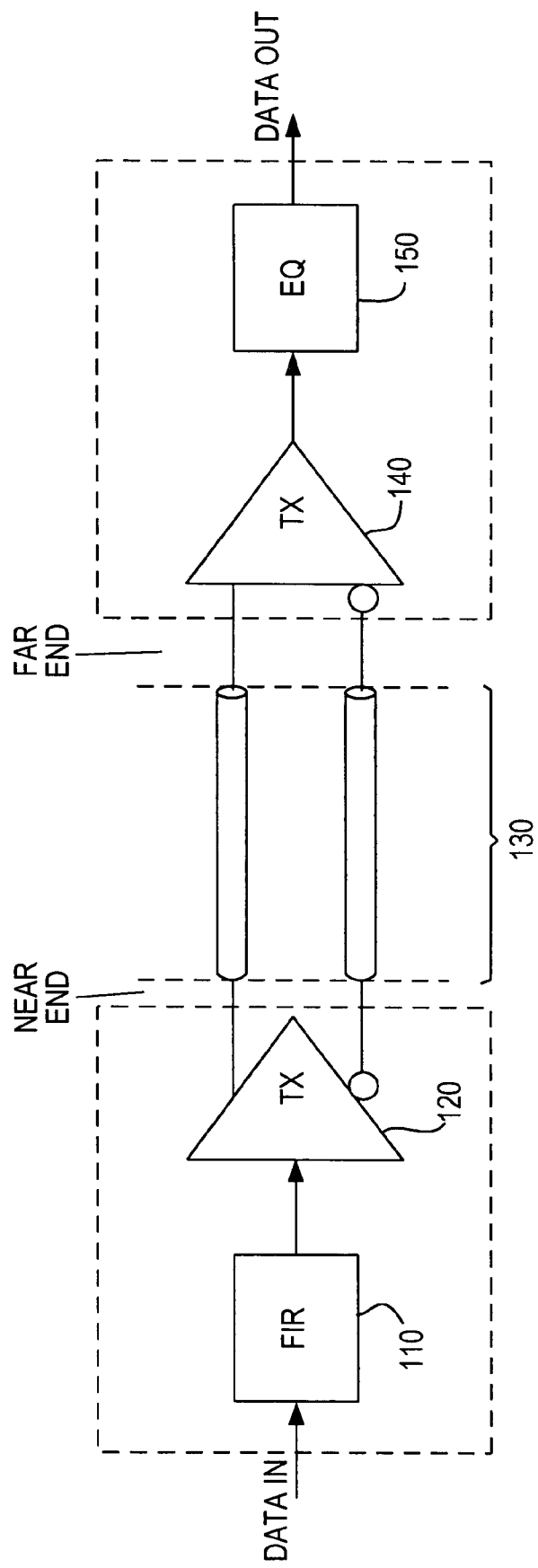
FIG. 1 shows an illustrative block diagram of mathematical representations of a transceiver which may be modeled using a link simulation platform according to the principles of the present invention.

FIG. 1 shows an illustrative block diagram of mathematical representations of a transceiver which may be modeled using a link simulation platform according to the principles of the present invention. The link simulation platform may model a transceiver with pre-emphasis and equalization in which the model substantially emulates the actual behavior at the silicon level in an actual transceiver. As shown, transceiver 100 may include a pre-emphasis filter 110, a transmitter 120, a transmission medium or backplane 130, a receiver 140, and an equalizer 150. As shown in FIG. 1, pre-emphasis filter 110 and transmitter 120 are enclosed by a dashed-line box to indicate that these two components may be mathematically modeled together. As also shown, equalizer 150 and receiver 140 are enclosed by a dashed-line box to indicate that these two components may be mathematically modeled together. In operation, data is provided by a data source (not shown) for transmission from transmitter 120 to receiver 140 over medium 130. The data may be modified by pre-emphasis filter 110 prior to entering the so-called near-end of medium 130. The output from transmitter 120 may be referred to as the transmitter output data signal. The transmitter output data signal is modified by medium 130 and exits medium 130 at the so-called far-end. The data signal exiting medium 130 may then be further modified by equalizer 150.

Figure 2:
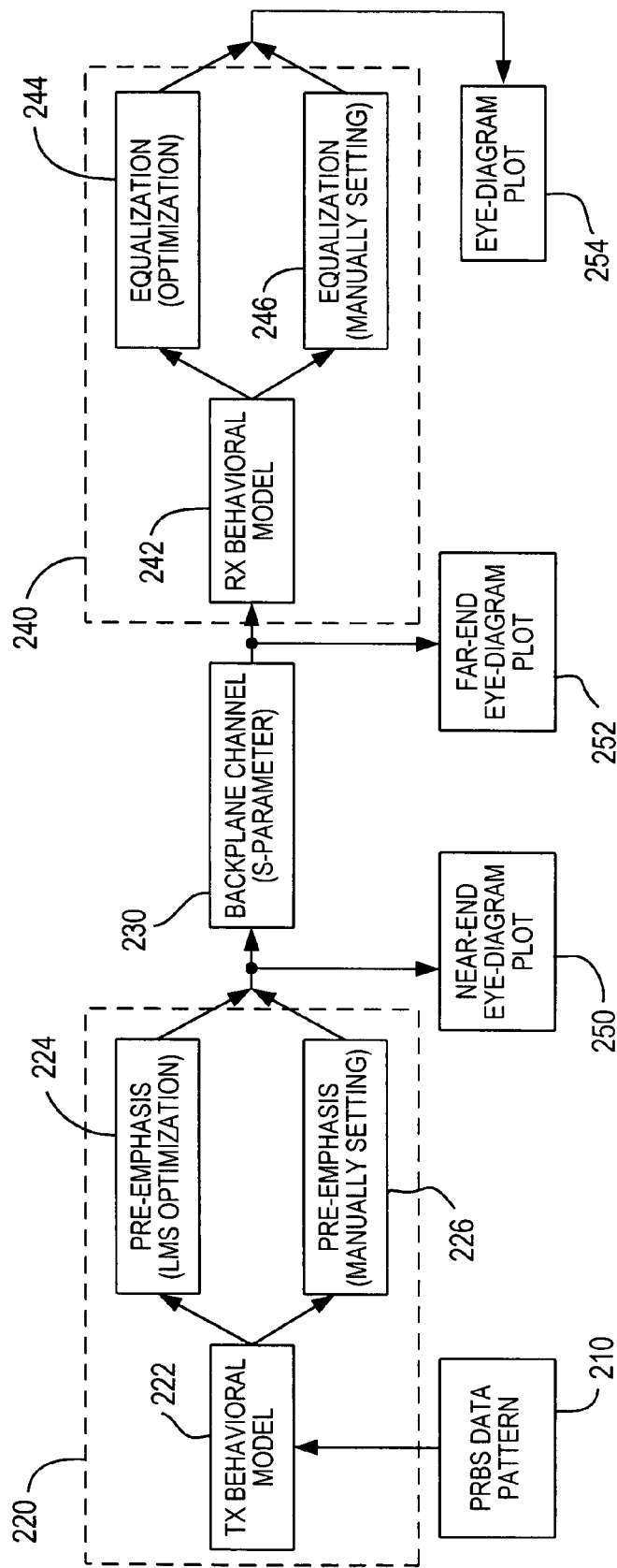
FIG. 2 shows a graphical flowchart of a full link simulation platform in accordance with an embodiment of the present invention.

The link simulation platform according to the invention simulates how a signal propagates through transceiver 100 by mathematically modeling how each portion of transceiver modifies a received data signal data. FIG. 2 shows a graphical flowchart 200 of a full link simulation platform in accordance with an embodiment of the present invention. FIG. 2 represents a "full" link simulation platform as opposed to FIG. 3, which shows a graphical flowchart 300 of a "partial" link simulation platform in accordance with an embodiment of the present invention. A full link simulation platform may enable a user to simulate signal integrity of a signal traversing a full link (e.g., including the transmitter portion, the transmission medium, and receiver portion). A partial link simulation platform may enable a user to predict signal integrity of a signal traversing a partial link (e.g., including the transmitter portion and the transmission portion, but not the receiver portion).

Regardless of whether a full or partial link simulation platform is used, the link simulation platform quickly and accurately determines the optimum settings or parameters for one or more components (e.g., transmitter and/or receiver) of an actual transceiver, in view of various and often substantial number of constraints (e.g., transmission medium and data rate). For example, a user may wish to use an existing or legacy transmission medium (e.g., backplane) in connection with an older generation or newly developed transceiver having both transmitter pre-emphasis and receiver equalization. In addition, the user may indicate that signals be transmitted at a predetermined data-rate, among other things. However, after constructing such a link, a user may not know which pre-emphasis setting or equalization setting to use to obtain optimum link performance. The link simulation platform, taking all the constraints into account, may automatically perform an optimization and/or a sweep of all available combinations of pre-emphasis and equalization settings and indicate to the user which settings yield the best link performance. The user may then configure the actual transceiver according to those settings.

An advantage of the link simulation platform is that it predicts with a high degree of accuracy the performance of an actual HSSI link. That is, the simulated results (generated by the platform) may correlate with nearly perfect fidelity to the actual results obtained from the actual HSSI link. Since the link simulation platform may receive available transmitter and/or receiver settings (and take those settings into account when simulating link performance), the platform may provide a user with the best settings for an actual link being modeled in the link simulation platform.

The link simulation platform may obtain substantially high correlation between simulated and actual results using one or more behavioral models (e.g., behavioral models of a transmitter and a receiver) that incorporate silicon level parameters. Silicon level parameters may be obtained in a number of different ways. In one embodiment, silicon parameters may be extracted from silicon level tests run on the actual component or components (e.g., a transmitter with pre-emphasis) of the link. Several tests or a single test may be applied to the actual component or components to determine silicon level characteristics. When the test or tests have been run, parameters may be obtained (or at least approximated) from the test results. Silicon-level extraction is obtained through tools that work on the actual physical layout of the transistors and other devices that reside in silicon, and how they are interconnected. Parasitics from the physical layout which may not have been present in the pre-layout circuit design (e.g., at the schematic level) can be back-annotated with some of these physical effects, or simply the netlist of the extracted netlist can be examined and/or simulated to obtain the final "extracted" parameters. For example, an equalizer may be designed to have 15 dB of peak gain at 3.125 GHz. After physical layout and extraction, it may be found that the actual amount of gain is 14.9 dB, at 3.115 GHz. This is due to additional parasistics that exist in the physical layout.

In another embodiment, silicon level parameters may be extracted from measurement data obtained from an actual component or components or from an equivalent circuit of the actual component or components. Although the above example may be a case where it may be difficult to measure the output of an equalizer that is deep within a chip (e.g., there may not be a pad out to see this node), other measurements may be more directly measurable such as pre-emphasis. For example, the amount of pre-emphasis may be measured at the near end.

A specific example of silicon level parameters that may be obtained include tap-coefficients of a pre-emphasis filter of a transmitter with pre-emphasis. Another specific example of such parameters that may be obtained include the gain and zero and pole locations of an analog equalizer.

Behavioral models for transceivers may be stored in the link simulation platform, thereby providing behavioral models for use by the platform when simulating link performance. Although reference is made to behavioral models for transceivers, this is understood to include behavior models for any component or combination of components of a transceiver. For example, behavioral models for transceivers may include any one or a combination of the behavioral models for a transmitter, a transmitter with pre-emphasis, a receiver, and a receiver with an equalizer.

It is understood that several behavioral models may be stored in the link simulation platform and that the simulation platform is operable to receive additional behavioral models (for example, to accommodate transceivers yet to be developed or to accommodate transceivers not represented by a behavioral model stored in the platform). For example, a behavioral model, according to the principles of the invention, may emulate the behavior of a known transceiver. Thus, when a user wishes to use a particular transceiver, the link platform may select the behavioral model corresponding to that particular transceiver. It is understood that behavioral models may be provided that do not emulate known transceivers, but theoretical transceivers.

The number of behavior models used by the link simulation platform may depend on the transceiver being modeled. For example, if the transceiver includes only a transmitter, then a behavioral model for that transmitter may suffice. In another example, if the transceiver includes both a transmitter and a receiver, then two behavioral models may be needed: one to emulate the transmitter behavior and another to emulate receiver behavior.

The link simulation platform may allow a user to choose arbitrary transmitter and receiver combinations and perform link performance simulations. For example, a user may choose a transmitter (e.g., from a first vendor) and a receiver (e.g., from a second vendor) and run a link performance simulation. If desired, the user may choose a different receiver (e.g., from the first or third vendor or a different model from the same vendor) and re-run a link performance simulation with the newly selected receiver. This example illustrates an advantage realized by the link simulation platform—an advantage of providing quick and accurate prediction of link performance, regardless of which transceiver or individual transceiver components are selected.

The link simulation platform may perform link simulations based on a user specified transmission medium (e.g., backchannel). Preferably, any or all physical limitations and non-idealistic characteristics are taken into account for a given transmission medium. Such limitations and characteristics are typically embodied in S-parameters. In one embodiment, the link simulation platform may include S-parameters for known or legacy transmission mediums. In other embodiments, the link simulation platform may receive user input (e.g., a file) of S-parameters defining a particular transmission medium.

A further advantage of the link simulation platform is that it can be constructed using known software (e.g., MATLAB, Mathematica, etc.) or programming languages (e.g., C, C++, Pearl, Java, etc.). As such, users may simulate link performance without having to purchase or license expensive link simulation software packages. However, to save users time and money from building their own link simulation platform using either known software or programming languages, the link simulation platform of the present invention may be incorporated into a software package available for sale or license. If desired, the software package may be customized for a particular customer. In addition, support may be provided in which, for example, updated and new behavioral models are provided to the customers for inclusion into their existing software package. Furthermore, subsequent releases of a link simulation platform software package may include, for example, updated and new behavior models.

Figure 4:
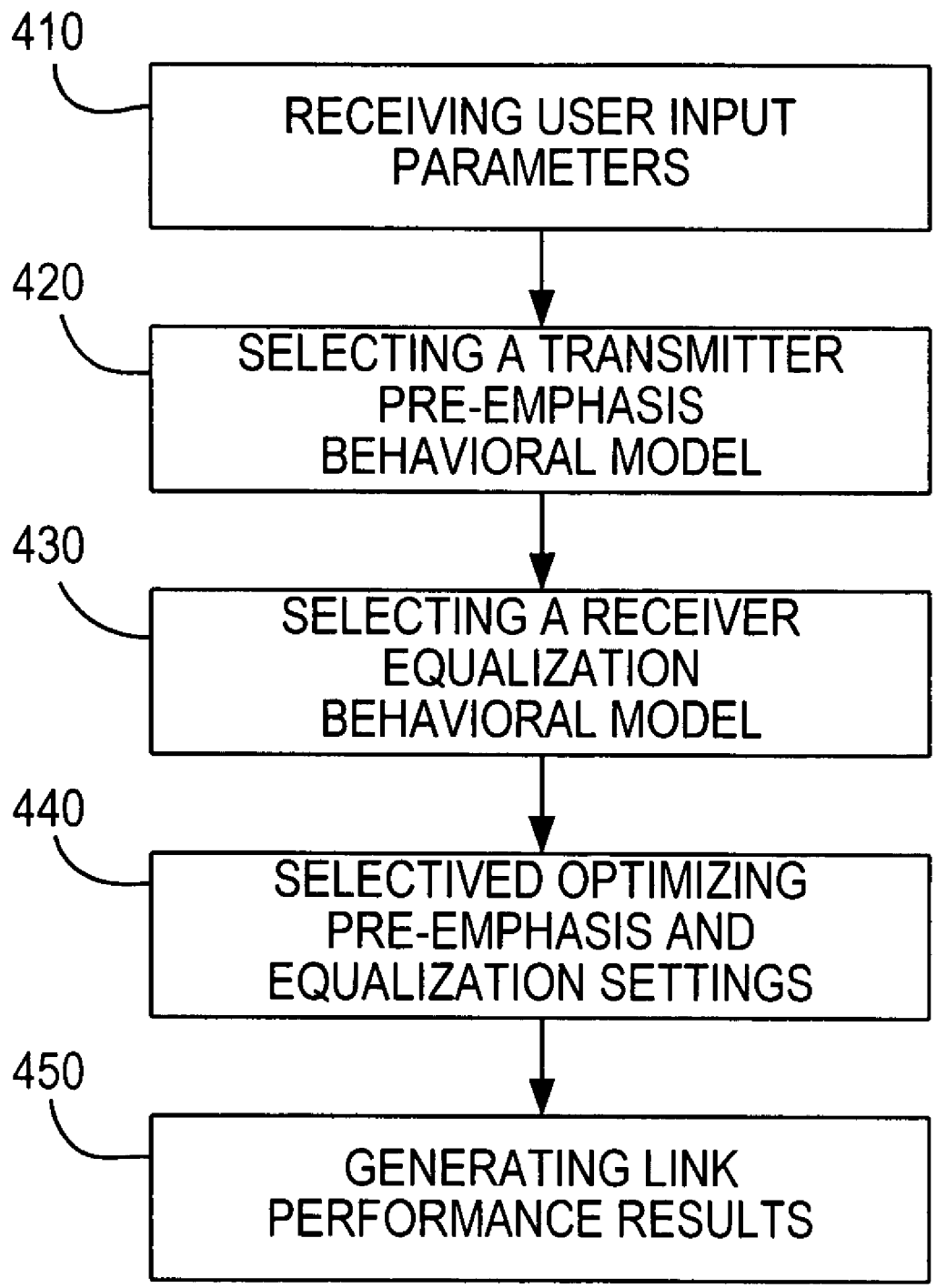
FIG. 4 shows a flowchart illustrating steps that may be taken by a link simulation platform to predict link performance in accordance with an embodiment of the present invention.

FIG. 2 is now discussed in combination with FIG. 4, which is a flowchart illustrating steps that may be taken by a link simulation platform to predict link performance in accordance with an embodiment of the present invention. Starting at step 410, user input parameters are received. User input parameters may include all user definable parameters that may be used by the link simulation platform. For example, user input parameters may include product selection (e.g., which transmitter with pre-emphasis and receiver with equalization is to be simulated), transmission medium selection (e.g., a backplane), optimization mode selection (discussed below), and signal characteristic selection (e.g., data rate, amplitude, other parameters that lead to a maximum allowable bit-error-rate, etc.). The selected transmission medium is graphically illustrated in box 230 of FIG. 2.

At step 420, the link simulation platform selects a transmitter pre-emphasis behavioral model based on a received user input parameter (e.g., an indication of an actual transmitter to be simulated). The selected transmitter pre-emphasis behavioral model is graphically illustrated in box 220 of FIG. 2. Box 220 includes several boxes (e.g., boxes 222, 224, and 226) to illustrate that the link simulation platform can adjust pre-emphasis settings of the transmitter behavior model (box 222) by either optimizing the settings (box 224) or manually setting the settings (box 226). Manually setting the pre-emphasis settings enables a user to ascertain link performance at a specified setting. When optimizing the settings, the link simulation platform may cycle through all available settings and determine which one provides the best link performance.

At step 430, the link simulation platform selects a receiver equalization behavioral model based on a received user input parameter. The selected receiver equalizer behavioral model is graphically illustrated in box 240 of FIG. 2. Box 240 includes several boxes (e.g., boxes 242, 244, and 246) to illustrate that the link simulation program can adjust equalizer settings of the receiver behavioral model (box 242) by either optimizing the settings (box 244) or manually setting the settings (box 246).

At step 440, the link simulation platform may selectively optimize pre-emphasis and equalization settings. A user input parameter (e.g., optimization setting) may determine whether the pre-emphasis and equalization settings are optimized or set manually. For example, the link simulation platform may provide a user with four optimization modes, which include: 1) pre-emphasis is manually set, with equalization automatically optimized; 2) pre-emphasis is automatically optimized, with equalization manually set; 3) pre-emphasis and equalization are automatically optimized; and 4) pre-emphasis and equalization are manually set. When a setting is optimized, whether for pre-emphasis, equalization, or both, the link simulation platform automatically searches for the optimal settings for the selected transmission medium and selected signal characteristics. As will be discussed in more detail below, the link simulation platform may use optimization algorithms according to embodiments of the invention. When a setting is manually set, it may be set, for example, according to actual device settings or user specified settings (which may be input at step 410).

At step 450, the link simulation platform may generate link performance results. Referring to FIG. 2, eye-diagrams 250, 252, and 254 may be generated to graphically illustrate link performance at various points along the link in response to a received data pattern provided by data pattern generator 210 (e.g., a pseudo-random bit sequence (PRBS) pattern generator). Eye diagrams are known in the art and are generally used to analyze the transition time deviations of a signal (e.g., a randomly generated data pattern traversing a link). The deviations, also known as jitter, are a measure of the signal quality and represent the variance in the actual transition time from the ideal transition time. Increases in jitter may lead to increases in the bit-error ratio. In addition to jitter, an eye diagram may also produce information on the voltage swing, the rise time, and the fall time of the signal. Jitter is apparent when a repetitive waveform is displayed versus a reference waveform.

Data pattern generator 210 may provide an arbitrary data pattern having a predetermined amplitude and data rate. The link simulator platform processes that data pattern using the behavioral models in boxes 220 and 240, while taking into account the transmission medium as shown in box 230 to predict link performance. The user may observe the eye-diagrams to assess the performance of the link. In addition, if any optimization settings (e.g., whether for pre-emphasis, equalization, or both) were found, the link simulation platform may provide those settings to the user.

Other link performance results that may be generated include prediction of BER and cross-talk performance.

It is understood that the steps shown in FIG. 4 are merely illustrative and that additional steps may added as desired, or that existing steps may be omitted or modified. For example, a step may be added to show that the link simulation platform may take into account whether a particular portion of a link is AC-coupled or DC-coupled. In addition, another step may be added to show that the link simulation platform may take into account effects of a package, board, and package-to-board interconnection of a link.

Figure 3:
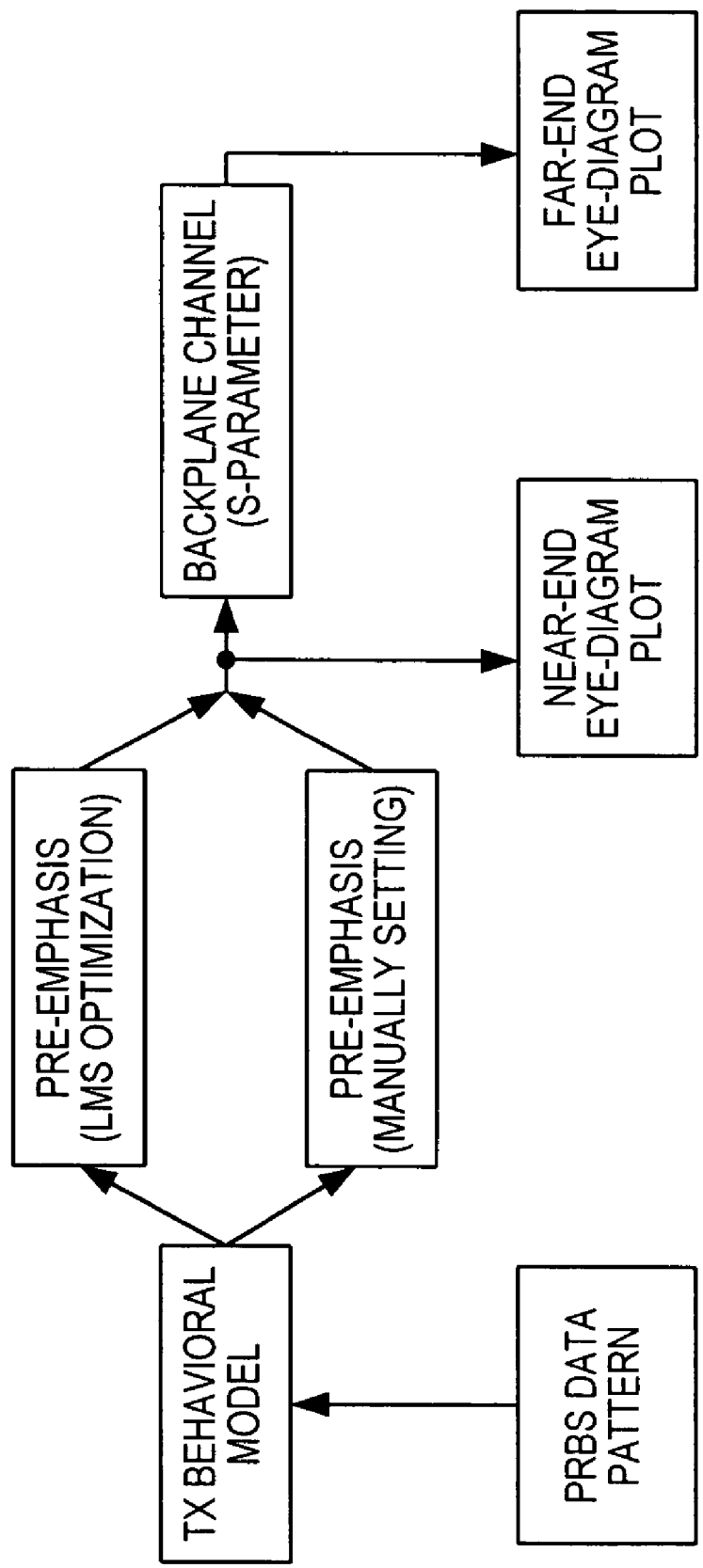
FIG. 3 shows a graphical flowchart of a partial link simulation platform in accordance with an embodiment of the present invention.

It is understood that if the link simulation platform uses a partial link such as that shown in FIG. 3, the link simulation platform may only generate link performance results with respect to the transmitter behavioral model and the transmission medium, but not the receiver behavioral model.

Transceiver behavioral pre-emphasis behavioral modeling is now discussed. Transmitter pre-emphasis is a technique widely used in high-speed transceivers to counteract ISI caused by PCB traces, connectors, chip packages, channel bandwidth limitations (e.g., skin-effect loss, dielectric losses, reflection, cross-talk, etc.), group delay distortion, and other ISI inducing effects. An effect of ISI is that the receive eye at the far-end of transmission medium 130 may be too weak to sustain satisfactory performance (e.g., the eye may be too small to be recovered by clock-data-recovery (CDR) circuitry, causing bit errors to occur).

Thus, it is desirable to optimize transmitter pre-emphasis parameters (e.g., FIR tap coefficients) for a given transmission medium (or backplane) to minimize ISI. It is understood that before transmitter pre-emphasis is optimized, the link simulation platform of the present invention may create a transmitter pre-emphasis behavior model. This model may then be used in combination with an accurately modeled or described link (e.g., through the use of S-parameters of the transmission medium), and optionally with a receiver equalization model, to predict signal integrity across a link. It is further understood that when the transmitter pre-emphasis model is created, the transmitter pre-emphasis parameters may be optimized, as discussed in more detail below in connection with FIG. 9.

Figure 5:
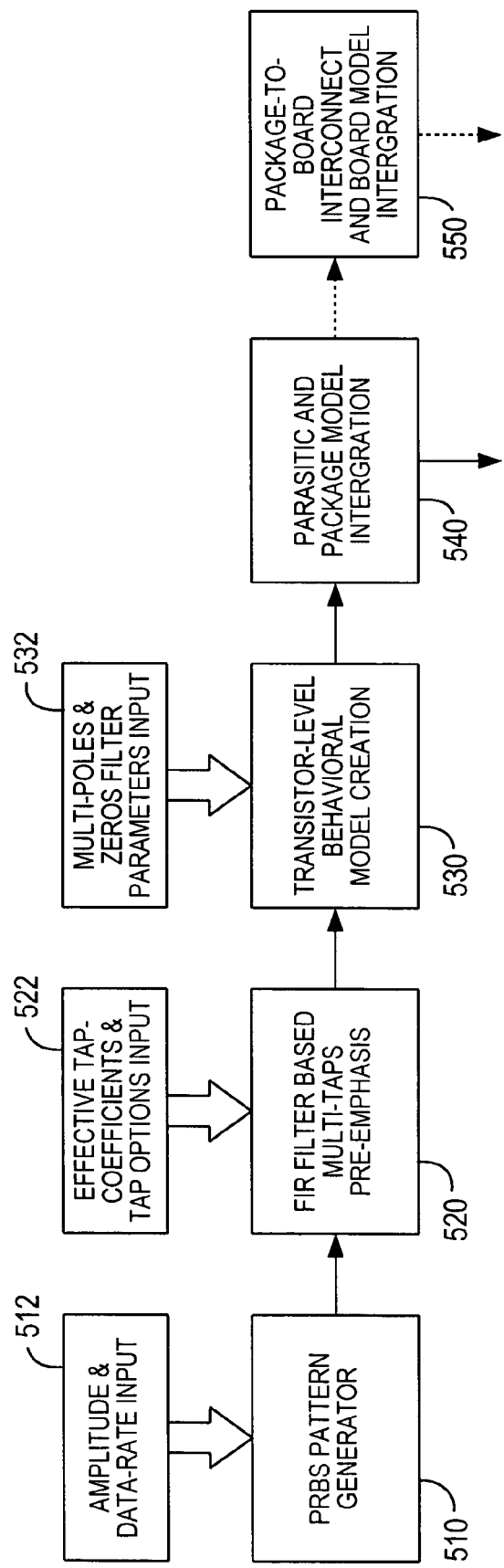
FIG. 5 is a graphical flowchart illustrating steps that may be taken to generate transmitter pre-emphasis behavioral models in accordance with an embodiment of the present invention.

Transmitter behavioral pre-emphasis models may be created using any software or programming language capable of performing matrix computations such as, for example, Matlab or C. The computations may take place in both the frequency and time domain. Alternatively, some computations may take place in one domain (e.g., frequency) and other computations may take place in the other domain (e.g., time). FIG. 5 is a graphical flowchart illustrating steps that may be taken to generate transmitter pre-emphasis behavioral models. Starting at box 510, a pseudo random bit sequence (PRBS) pattern generator may generate a waveform having a specified data rate and amplitude from a pseudo-random bit sequence data pattern having an arbitrary or defined bit width. The data rate and amplitude may be provided by a user, as indicated by box 512 (and as also indicated by step 410 of FIG. 4).

At box 520, a (FIR) filter (e.g., a Z-domain FIR filter) is modeled using tap-coefficients extracted from silicon level parameters of an equivalent circuit of a transmitter pre-emphasis filter or silicon level simulation of an actual transmitter pre-emphasis filter (provided by box 522). As is known, a FIR filter-based pre-emphasis function may be used to boost the high frequency content of a transmitted signal, thereby extending the bandwidth of the combined pre-emphasis and channel transfer functions. The FIR filter modeled in box 520 may be a symbol-spaced or a fractionally spaced filter.

Figure 6:
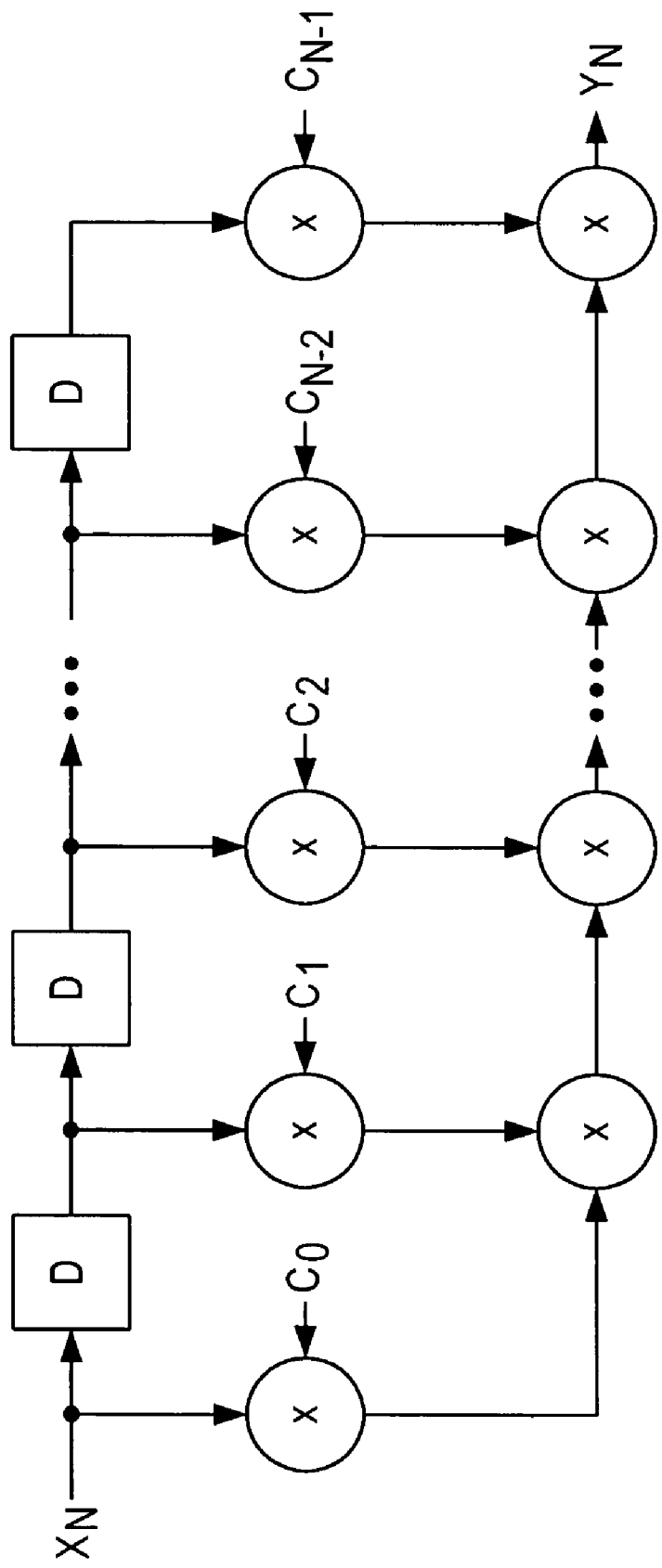
FIG. 6 shows a block diagram of a FIR filter that may be modeled in accordance with an embodiment of the present invention.

The structure of a symbol-spaced FIR (SSF) filter that may be modeled in box 520 is shown in FIG. 6. For symbol-spaced FIR (SSF), the delay D is equal to one symbol period T. The transfer function of SSF in Z domain is given by:

$$H(z) = \sum_{n=0}^{N-1} C_n \cdot z^{-n} \quad (1)$$

where $C_n$ represents the extracted tap coefficients, $z=\exp(j2\pi f/f_s)$, and the sampling frequency $f_s=1/T$. For a fractionally spaced FIR (FSF), the delay D is a fraction of T (e.g., D=T/2). Hence the transfer function defined by equation 1 may be one of the mathematical constructs uses to model transmitter behavior.

Using tap-coefficients extracted from an equivalent circuit of a transmitter pre-emphasis filter or silicon level simulation of an actual transmitter pre-emphasis filter. This may reflect the actual behavior, as opposed to an ideal behavior, of a transmitter at real circuit implementation and ensures that the transmitter pre-emphasis behavioral model accurately substantially emulates the behavior of an actual transmitter with pre-emphasis.

At box 530, transistor level behavior of the transmitter pre-emphasis is modeled. Transistor level behavior includes transistor switching behavior, parasitic, account non-idealities such as headroom limitations, transistor charging-sharing effects, and parasitics from routing on silicon, ESD, bump pads, and loading conditions, terminations and even variations of the above. Such transistor level behavior may be modeled using a multi-pole and multi-zero filter. For example, a synthetic multi-pole filter is represented by the following mathematic equation:

$$H(\omega) = \frac{V_{scale}}{(1+j\omega/p_1)(1+j\omega/p_2)^{n_p}} \quad (2)$$

$$n_p = \text{Integer}(a/f_n)$$

$$p_1 = (b_0 + b_1 * Tap_1 + b_2 * Tap_2 + \ldots) * V_{scale}/f_n$$

$$p_2 = c/f_n$$

$$f_n = f_{rate}/f_{rate\_max}$$

$$V_{scale} = V_{out}/1000$$

Where $V_{out}$ may be the output amplitude of the transmitter in unit of mV; $f_{rate}$ may be the signal data rate; $f_{rate\_max}$ may be the maximum transmitted data rate available from the transceiver; a may be a weighting factor with a range of 1 to 2; $b_0$ may be a weighting factor of main-tap of transmitter pre-emphasis with a range that may be 1 to 3; and $b_1, b_2 \ldots b_n$ may be weighting factors of pre-emphasis taps with a range that may be between, for example, 0 to 0.2.

The number ($n_p+1$) of poles may be a function of the signal data-rate. Moreover the pole position may be a function of the signal data rate, transmitter output amplitude, s and any linear or non-linear effects such as slew rate limitations and rise/fall times.

Multi-poles and zeros filter input parameters may be provided at box 532 that are used to fit the simulated performance (at the transistor/extracted level) and may help tweak the actual shape of the behavioral model at time of correlation.

The transmitter pre-emphasis behavior model may also account for the effects of packaging and parasitics associated therewith, as indicated in box 540. The package model may be imported to the simulation platform as simulated or measured S-parameter data. The transmitter pre-emphasis model may account for a signal coupling option (e.g., AC-coupled or DC-coupled). The transmitter pre-emphasis model may take into account package-to-board interconnections, the board, and connectors interconnecting the board and package, as indicated in box 550, as needed for accurate correlation with the behavioral model.

By way of example, it has been found that simulation data obtained from a transmitter pre-emphasis behavior model of the present invention correlates remarkably well to actual data obtained from actual transmitters with pre-emphasis. FIGS. 7A and 7B show eye-diagrams comparing transmitter output at the near end of the actual transmitter and the behavior transmitter model at two different data-rates. In particular, FIG. 7A shows eye-diagrams obtained from measuring an actual transmitter output at the near end at 3.125 Gb/s and 6.5 Gb/s data rates. FIG. 7B shows eye-diagrams generated by the link simulation platform of the present invention, at the near end at the 3.125 Gb/s and 6.5 Gb/s data rates. Comparing FIG. 7A to FIG. 7B, it is seen that the output of the transmitter behavior model has good correlation to the output of the actual transmitter.

Creation of a receiver equalizer behavior model is now discussed. Equalizers are commonly used to compensate for ISI in addition to transmitter pre-emphasis. Equalizers are generally analog and have programmable gain, zero, and pole locations. The gain, zero, and pole locations may be programmed when equalizer settings are selected. In accordance with the principles of the present invention, behavior models of such equalizers can be modeled based on an equivalent circuit of a receiver equalizer or the model can be extracted from silicon level simulations of an actual receiver equalizer. Note the incorporation of silicon parameters into the receiver equalization behavior model is similar to the incorporation of silicon parameters into the transmitter pre-emphasis behavior model. By basing the receiver equalizer behavior model on silicon level parameters, the behavior of the models more closely correlates to the behavior of an actual receiver equalizer. It is understood that the receiver equalizer behavioral model may be used to optimize equalizer settings, as discussed in more detail below in connection with FIG. 10.

Figure 8:
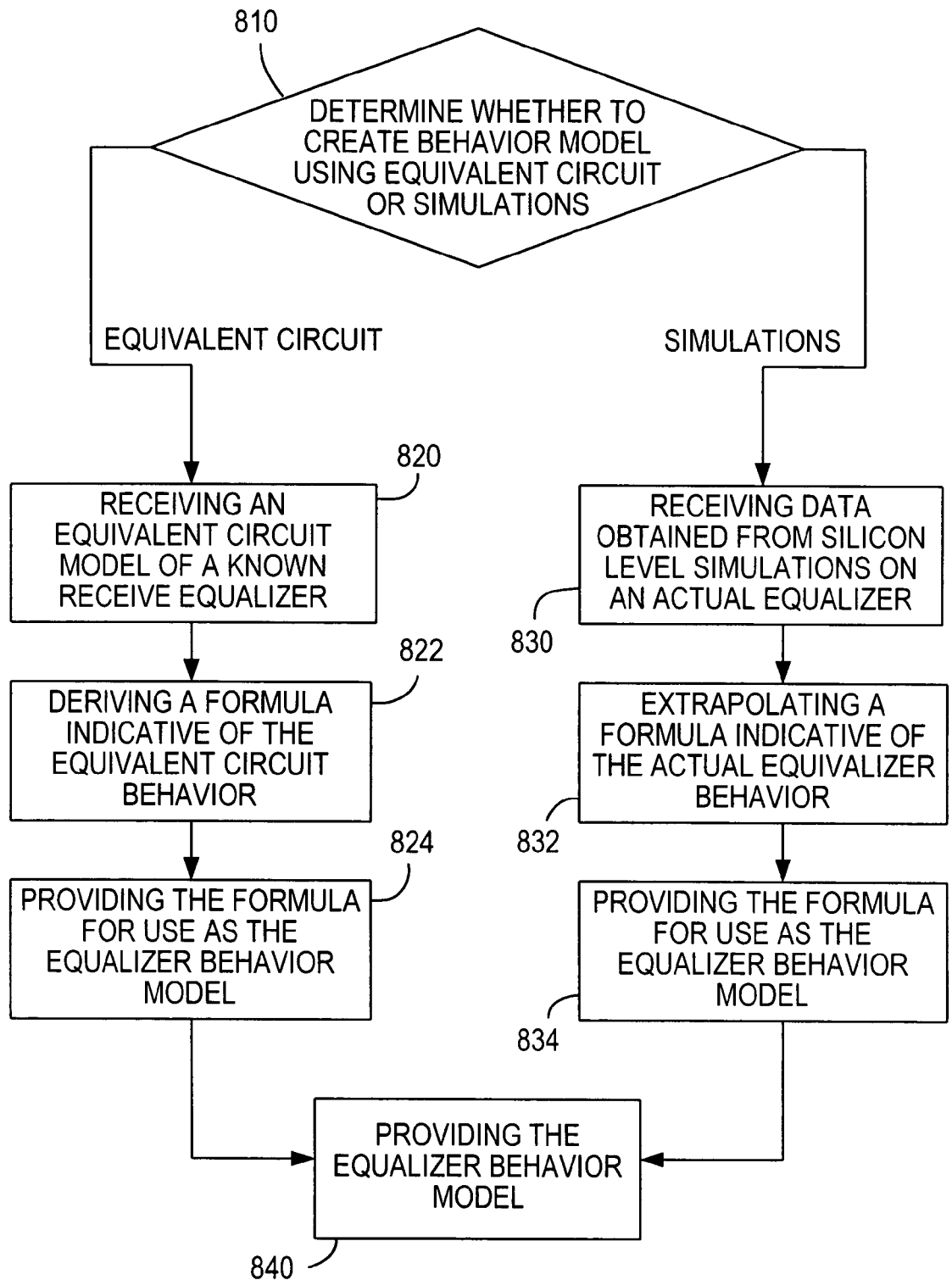
FIG. 8 is a flowchart illustrating steps that may be taken to create a receiver equalization behavior model in accordance with the principles of the present invention.

FIG. 8 is a flowchart illustrating steps that may be taken to create a receiver equalization behavior model in accordance with the principles of the present invention. Beginning at step 810, a determination is made as to whether a receiver equalization behavior model is to be created by extracting a formula (e.g., a transfer function) from an equivalent circuit of a known receiver equalizer or by extrapolating a model from silicon level simulations of an actual receiver equalizer. If the behavior model is to be created based on an equivalent circuit, the process may proceed to step 820.

At step 820, the link simulation platform may receive an equivalent circuit model of a known receiver equalizer. At step 822, the link simulation platform may derive a formula from the equivalent circuit model indicative of the equivalent circuit's behavior. At step 824, the formula may be provided for use as the equalizer behavior model.

If, at step 810, the behavior model is to be created based on simulations, the process may proceed to step 830. At step 830, the link simulation platform may receive data obtained from silicon level simulations on an actual equalizer. At step 832, a formula indicative of the actual equalizer's behavior may be extrapolated from the received data. At step 834, the formula may be provided for use as the equalizer behavior model. At step 840, the equalizer behavior model is provided.

It is understood that the steps shown in FIG. 8 are merely illustrative and that additional steps may be added and existing steps may be modified or omitted.

The link simulation platform may optimize pre-emphasis and equalization settings using one or more behavioral models (e.g., the transmitter pre-emphasis model and receiver equalization model) given a particular transmission medium in accordance with embodiments of the present invention. When an optimized setting is determined, the link simulation platform may indicate to a user (e.g., via a display screen) which setting is best, so that the user may program the transceiver in accordance with the optimized setting. Other metrics such as vertical and horizontal eye statistics may also be given.

Figure 9:
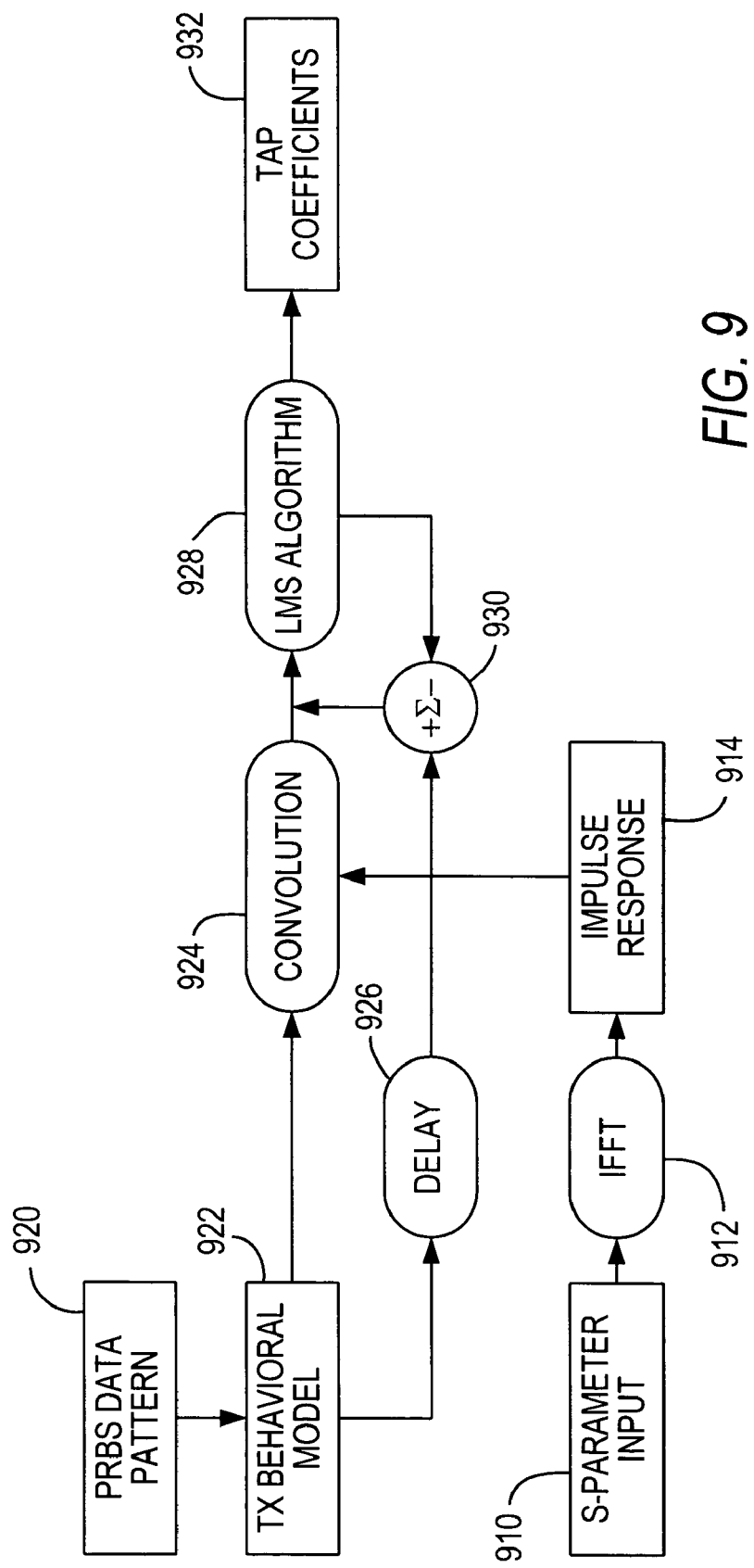
FIG. 9 shows a graphical illustration of a transmitter pre-emphasis optimization flowchart in accordance with the principles of the present invention.

FIG. 9 shows a graphical illustration of a transmitter pre-emphasis optimization flowchart in accordance with the principles of the present invention. For example, the optimization flowchart may be used to determine link performance at the far-end. Generally, tap-coefficients of a pre-emphasis filter are variable, and thus may be quantized to the available settings in the actual transmitter with pre-emphasis according to an optimization process according to an embodiment of the present invention. In other words, since an actual transmitter may have a predetermined number of available settings, the pre-emphasis optimization process is able to determine which of those available settings provide the best link performance. The pre-emphasis process operates as follows.

Beginning with box 910, a transmission medium impulse response (shown in box 914) may be obtained by applying an inverse fast fourier transform (IFFT) (shown in oval 912) to the S-Parameter inputs (box 910) of the transmission medium. Then, starting at box 920, a data pattern is provided to a transmitter behavior model (shown in box 922). The transmitter data signal produced by the behavior model is convolved (at oval 924) with the impulse response (of box 914) to provide a distorted data signal (that may be seen at the far end of the transmission medium). An error signal is produced by taking the difference between the time delayed transmitter data signal (provided by oval 926) and the FIR filter output (provided by oval 928). The distorted data signal and the error signal (provided by circle 930) are provided to a least-mean-square convergence engine (although other convergence engines could be used to perform optimization), which converges the error to drive the tap coefficients (shown in box 932) to optimized values. The LMS convergence engine may be based on the following equation:

$$C(n+1) = C(n) + \mu \cdot u \cdot e$$

Where C is the tap coefficient, $\mu$ is the step size, u is the distorted signal, and e is the error signal.

Figure 10:
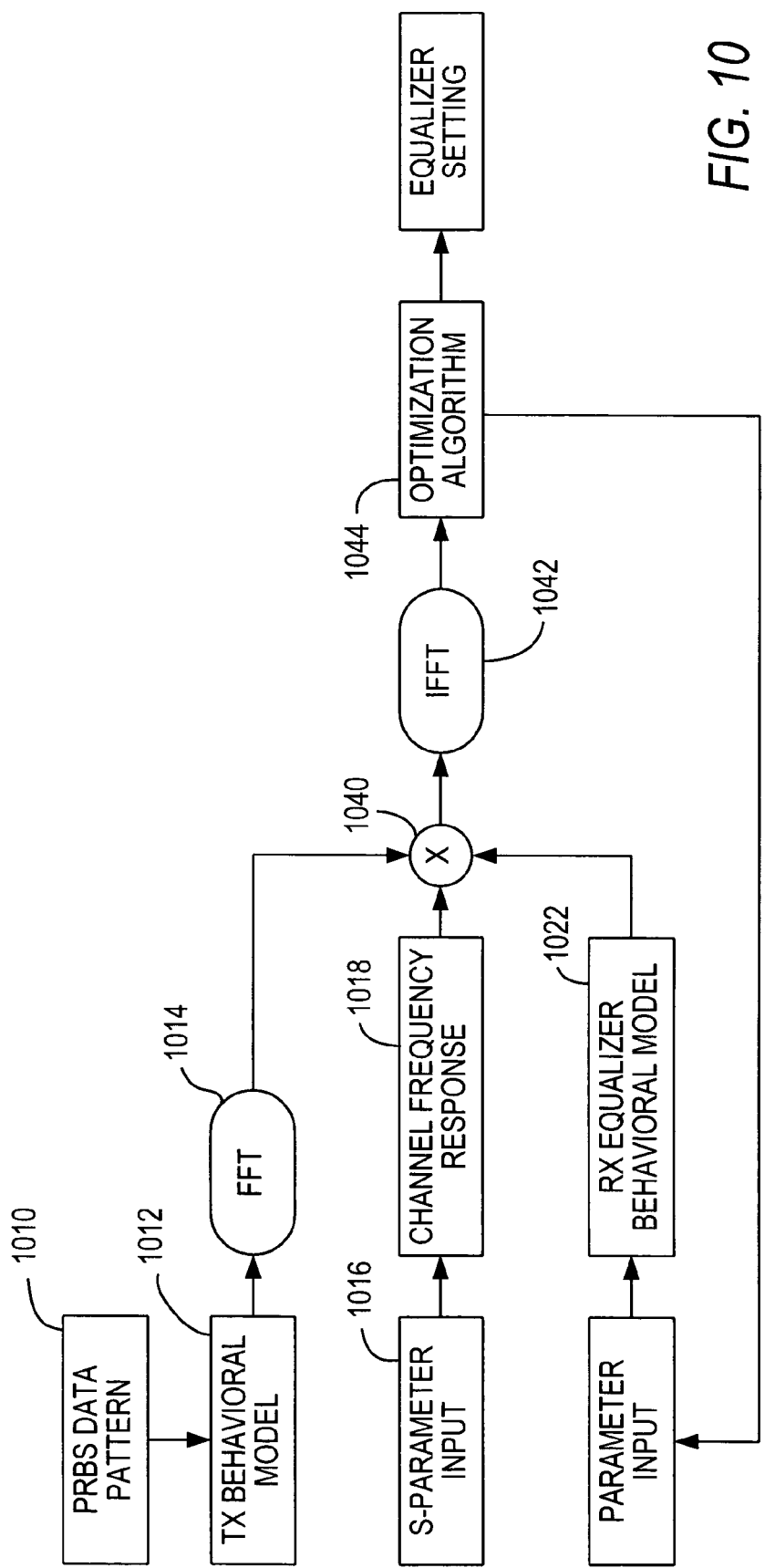
FIG. 10 shows a graphical illustration of a receiver equalization emphasis optimization flowchart in accordance with the principles of the present invention.

FIG. 10 shows a graphical illustration of a receiver equalization emphasis optimization flowchart in accordance with the principles of the present invention. This process optimizes equalizer performance and provides the best setting for a given backplane. For example, the process may be used to calculate post-equalizer performance. Starting at box 1010, a data pattern is provided to a transmitter behavior model (at box 1012) and the transmitter data output is converted to the frequency domain via fast fourier transform FFT (at oval 1016). At circle 1040, the frequency domain version of the transmitter output, the transmission medium frequency response (provided by box 1018 based on S-parameter data provided by box 1016), and transfer function of the receiver equalizer behavior model (provided by box 1022) are multiplied. The product is converted back to the time domain by an IFFT (at oval 1042) and provided to an optimization algorithm (at oval 1044). The parameter inputs (at 1020) are variable and may be changed at the direction of the optimization algorithm in order to determine the optimal equalization settings. The parameter inputs may include programmable gain, zero locations, and pole locations. It is understood that the data pattern provided to the transmitter behavioral model may change over time to ensure an optimal equalization setting is obtained. Several methods of optimization may be used. An example on such optimization method includes a full solution-space sweep.

Figure 11:
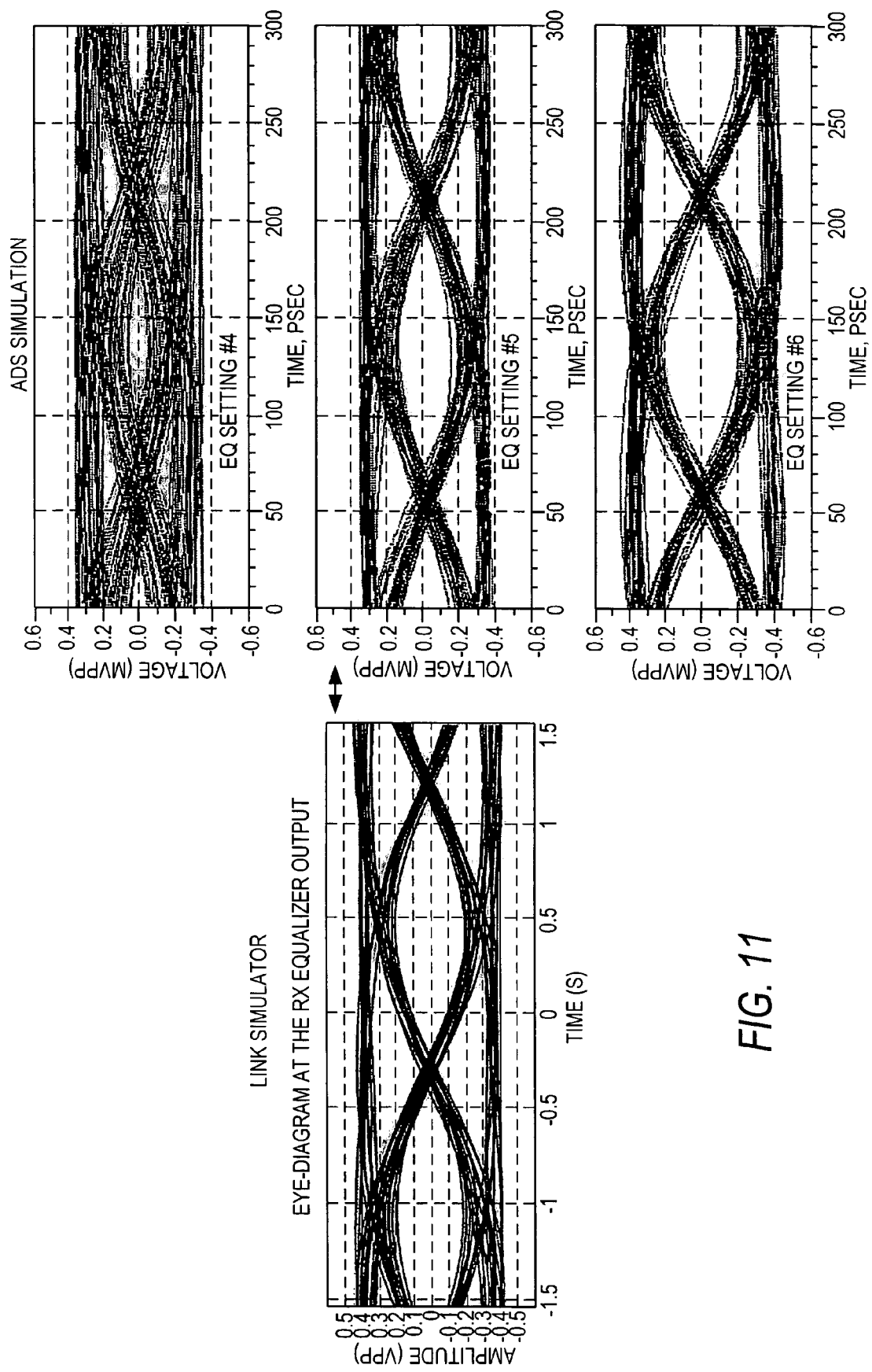
FIG. 11 illustrates an example in which an optimal equalization setting is found for a given backplane in accordance with an embodiment of the present invention.

Using the pre-emphasis and equalization optimizing processes in combination with a full link simulation platform may provide a user with several ways to reach an optimization goal. In one approach, an optimization goal may be to counteract ISI of a transmission medium without increasing crosstalk. This may be accomplished by setting the equalizer to a predetermined setting known to counteract ISI without increasing cross-talk and optimizing the pre-emphasis to a setting that best accommodates the equalization setting. FIG. 11 illustrates an example in which an optimal equalization setting is found for a given backplane. In particular, FIG. 11 shows an eye diagram (on the left) that was generated using a link simulation platform according to the invention. The eye diagram on the left hand side is representative of the optimal equalizer setting determined by the link simulation platform. The eye diagrams on the right hand side of the figure qualifies the link simulation platform's optimal equalization setting. The eye diagrams on the right hand side were obtained by generating transistor-level simulations using Agilent Technologies' Advance Design System signal integrity suite, but other similar tools may be used.

In another approach, pre-emphasis may be coarsely optimized such that the far end eye diagram is opened to a predetermined degree. When the predetermined degree of eye openness is achieved, the equalizer setting is optimized to compensate for residual ISI in the transmission medium. In yet another approach, pre-emphasis may be fully optimized to maximize the eye opening at the far end and then optimize the equalizer such that it can handle the residual ISI in the transmission medium.

Figure 12:
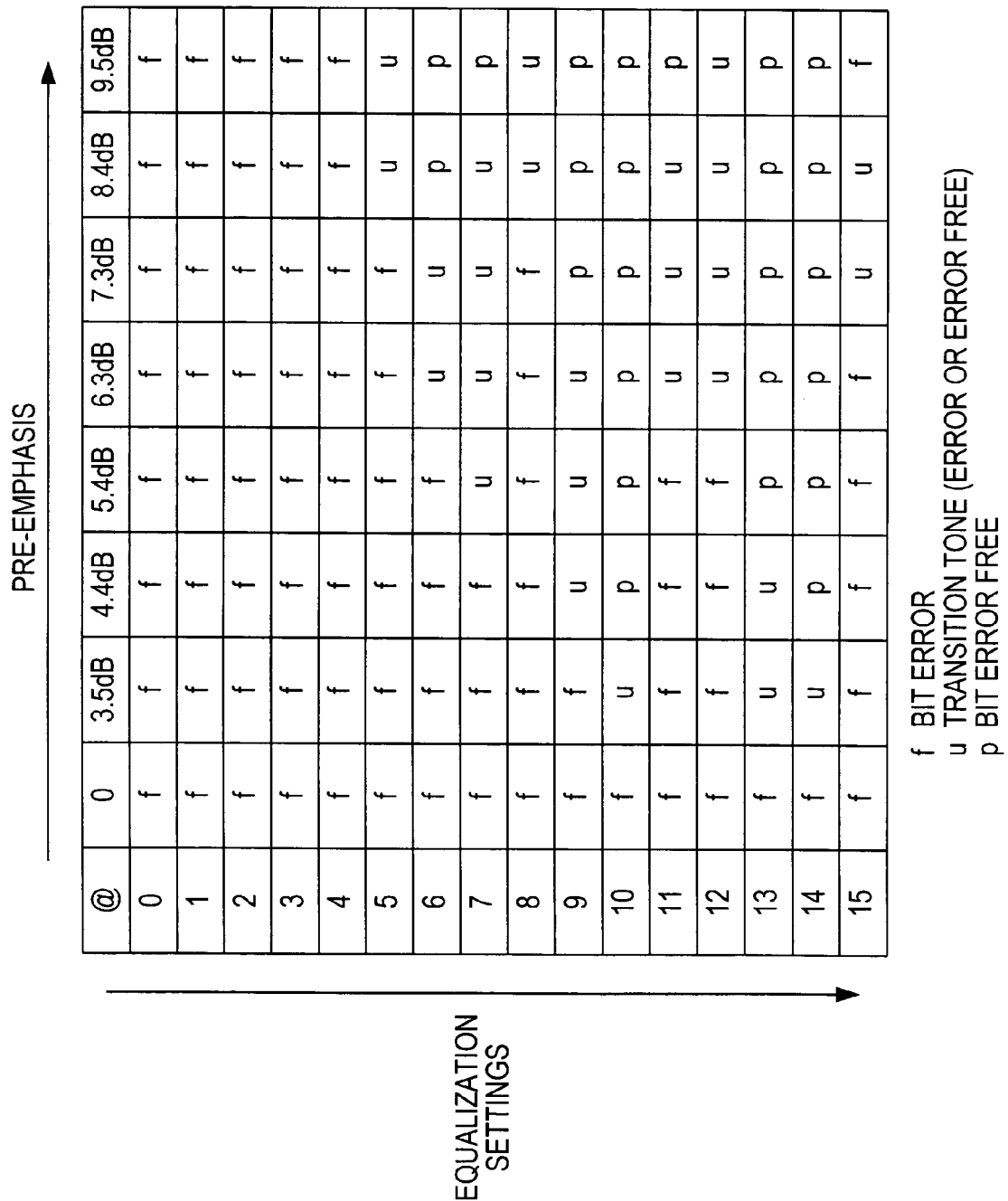
FIG. 12 shows a bit error prediction map that may be generated by a link simulation platform in accordance with an embodiment of the present invention.

The link simulation platform may predict the bit-error-ratio for a given transmission medium. More particularly, the link simulation platform may generate a BER prediction map for link across a range equalization and pre-emphasis settings. A user may then use the map to determine which pre-emphasis and equalization settings for a given data rate may yield bit error free operation. An example of such a map is shown in FIG. 12. FIG. 12 shows bit error prediction for a TYCO RT2 56" FR4 backplane operating at 6.5 Gb/s. For every combination of pre-emphasis and equalization settings, the link simulation platform generates a prediction value (e.g., f for bit error, u for transition zone—either error or error free, or p for error free) based on the simulated results. For example, at equalization setting 10 and pre-emphasis setting 7.3 dB, the link simulation platform predicts that there will be no bit error. The link simulation platform may make this determination by extracting a statistical eye mask from the simulated data obtained for these particular equalization and pre-emphasis settings.

FIG. 13 shows a map of the actual occurrence or non-occurrence of a bit error for each combination of pre-emphasis and equalization settings for a TYCO RT2 56" FR4 backplane operating at 6.5 Gb/s. In FIG. 13, "X" indicates an occurrence of a bit error and "O" indicates a non-occurrence of a bit error. Comparing FIGS. 12 and 13, it is seen that several of the "P's" correlate to the "O's", thus showing that the link simulation platform accurately predicts bit error.

Figure 14:
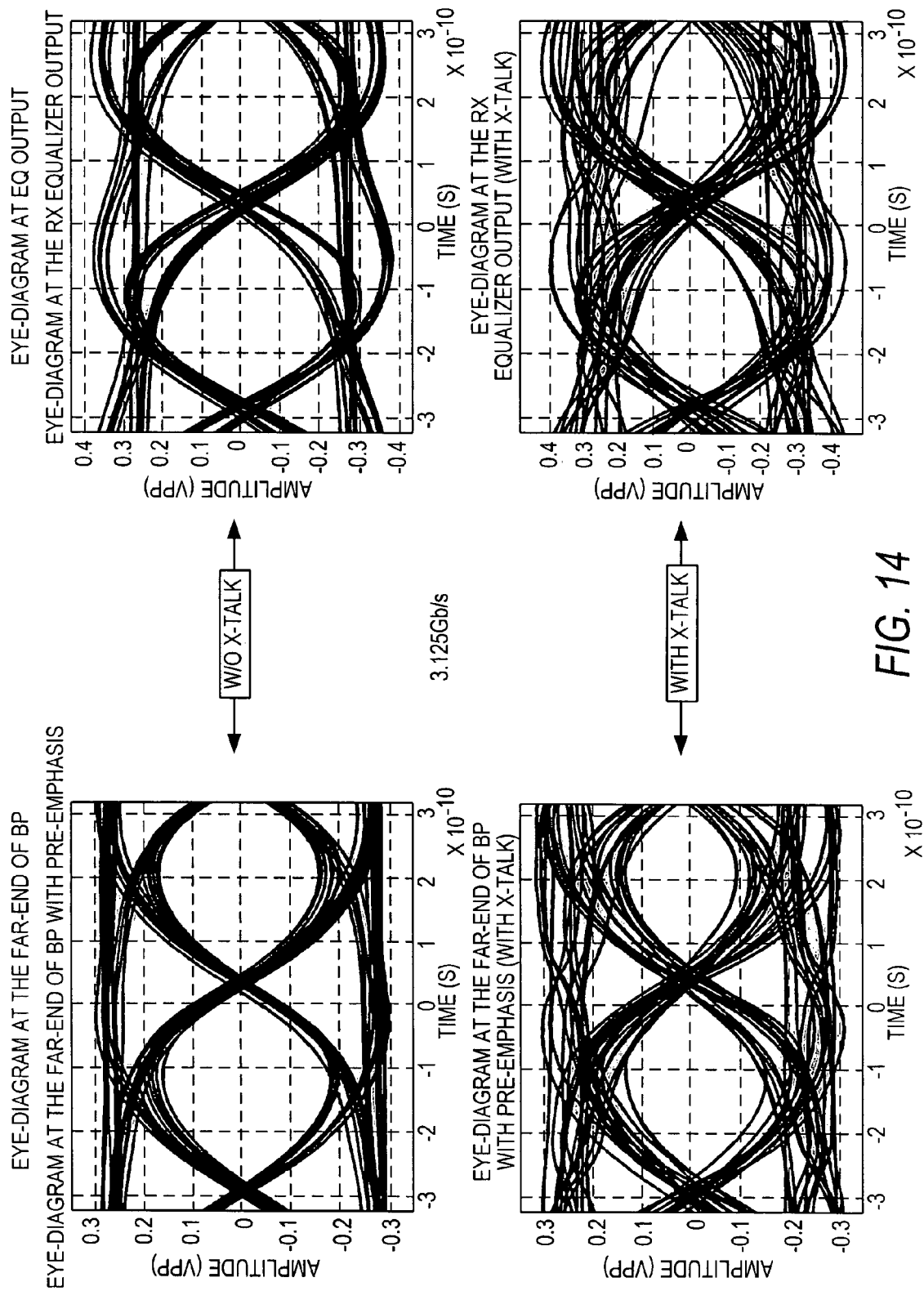
FIG. 14 shows eye-diagrams at the far end of a transmission medium and at the output of the equalizer with and without cross-talk.

The link simulation platform may also simulate cross-talk effects with single or multiple aggressors. In a multiple aggressor case, the link simulation platform may perform one of two calculations, depending on a coupling level between aggressors. When a coupling level between aggressors is below a predetermined threshold, the calculation may be a linear summation of each individual cross-talk. When a coupling level between aggressor is above a predetermined threshold, the calculation may be a linear or a square root of the summation of each individual cross-talker for pessimistic and optimistic estimates. A user may provide user input parameters as to how many aggressors are to be taken into account during simulation. FIG. 14 shows eye-diagrams at the far end of a transmission medium and at the output of the equalizer with and without cross-talk.

Figure 15:
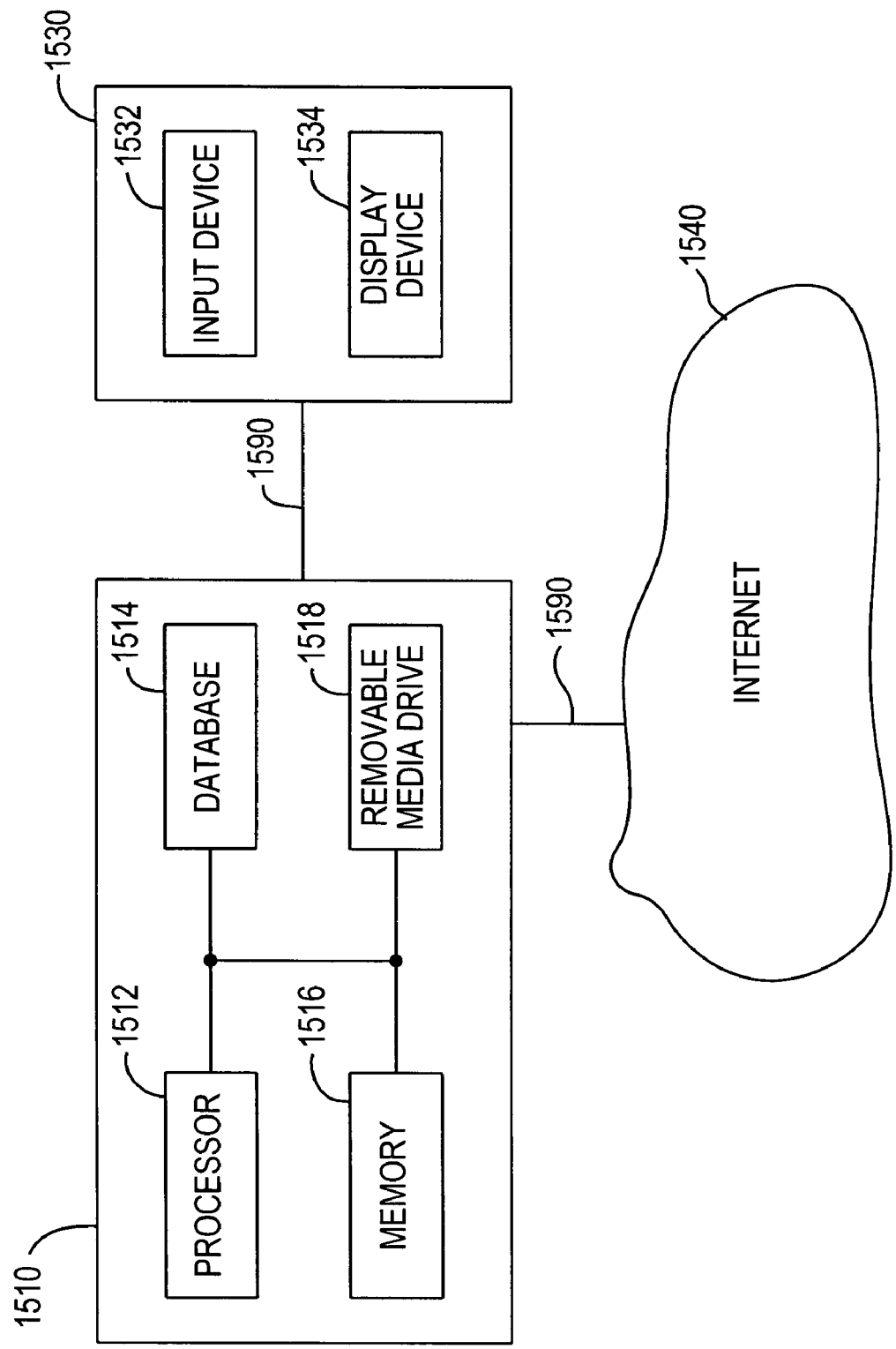
FIG. 15 shows an illustrative system 1500 in which a link simulation platform may be implemented in accordance with embodiment of the present invention.

The link simulation platform may be implemented on illustrative system 1500 shown in FIG. 15. System 1500 may include computer 1510, user interface equipment 1530, Internet 1540, and optional equipment (not shown). System 1500 may include multiple computers 1510 and user interface equipment 1530, but only one of each is illustrated in FIG. 15 to avoid complicating the drawing. Computer 1510 is shown to be connected to user interface equipment 1530, and Internet 1540 via communication paths 1590.

Computer 1510 may include circuitry such as a processor 1512, database 1514 (e.g., a hard-drive), memory 1516 (e.g., random-access-memory), and removable-media drive 1518 (e.g., a floppy disk drive, a CD-ROM drive, or a DVD drive). This circuitry can be used to transmit data to, from, and/or between user interface equipment 1530 and the Internet 1540. Computer 1510 may initiate commands of the invention by responding to user input from user interface equipment 1530. Computer 1510 may also provide information to the user at user interface equipment 1530 with respect to results obtained from operation of the link simulation platform.

Database 1514 may store data pertinent to the operation of the link simulation platform such as, for example, behavior models and S-parameters. Such data may be obtained, for example, from a readable medium (e.g., a floppy diskette, a CD-Rom, or a DVD) which can be accessed through removable-media drive 1518. Alternatively, data may be obtained through Internet 1540, where the data is transmitted from a server located, for example, at an IC vendor (e.g., Altera Corporation). If desired, database 114 may be updated with new data (e.g., behavioral models as it becomes available).

User interface equipment 1530 enables a user to input commands to computer 1530 via input device 1532. Input device 1532 may be any suitable device such as a conventional keyboard, a wireless keyboard, a mouse, a touch pad, a trackball, a voice activated console, or any combination of such devices. Input device 1532 may enable a user to enter commands on user interface to input parameters or cause a link simulation to be performed. A user may monitor processes operating on system 1500 on display device 1534. Display device 1534 may be a computer monitor, a television, a flat panel display, a liquid crystal display, a cathode-ray tube (CRT), or any other suitable display device.

Communication paths 1590 may be any suitable communications path such as a cable link, a hard-wired link, a fiber-optic link, an infrared link, a ribbon-wire link, a blue-tooth link, an analog communications link, a digital communications link, or any combination of such links. Communications paths 1590 are configured to enable data transfer between computer 1510, user interface equipment 1530, and Internet 1540.

Equipment (e.g., oscilloscope) may be provided in system 1500 for verifying the results obtained with the link performance platform.

The link simulation platform may be incorporated into a software package which may provide a user friendly interface for enabling a user to run link simulations in accordance with the principles of the present invention. The user interface may provide a graphical user interface (GUI) which may include drop-down menus or fields to allow a user to select or enter user input parameters (e.g., transmitter and/or receiver models, optimization settings, voltage amplitude of the data signal, the data rate, etc.).

Figure 16:
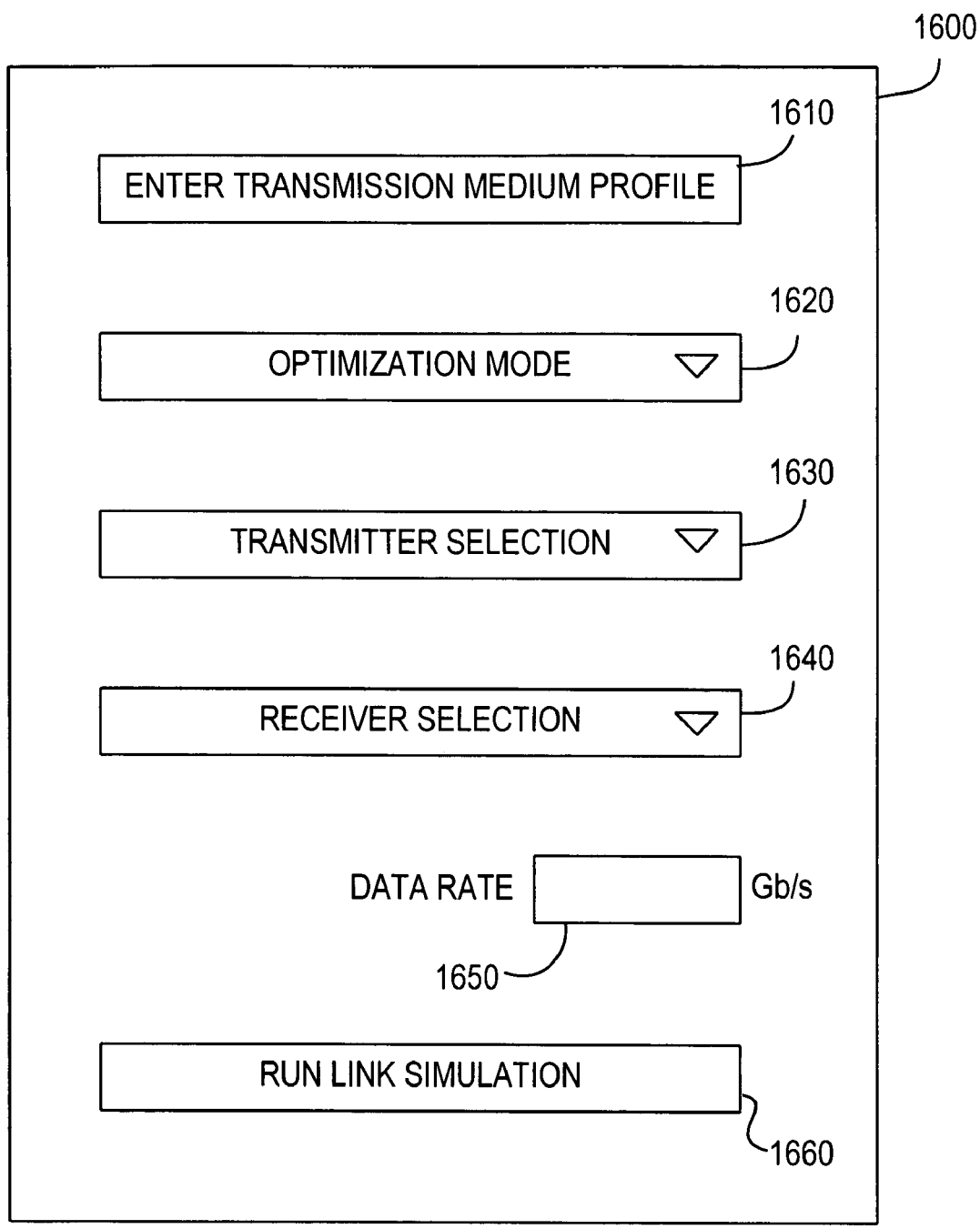
FIG. 16 shows an illustrative screen shot of a user interface in which a user may enter input parameters in accordance with an embodiment of the present invention.

FIG. 16 shows an illustrative screen shot 1600 of a user interface in which a user may enter input parameters in accordance with an embodiment of the invention. As shown, a user may select box 1610 to enter a transmission medium profile. For example, upon selection of box 1610, the user may be prompted to load in a file containing S-parameters of a particular transmission medium, or if transmission medium profiles are already in the software package, the user may select a desired transmission medium. At box 1620, an drop-down menu may be provided to allow a user to select an optimization mode (e.g., one of the four modes discussed above).

At boxes 1630 and 1640, drop-down menus may enable a user to select actual transmitter and receiver products to be simulated. As discussed above, the link simulation platform may be pre-coded with behavioral models corresponding to actual transceivers available for selection by the user. This advantageously enables the link simulation platform to quickly perform link simulations. At box 1650, the user may input a data rate to be used by the link simulation platform.

Box 1660 may be selected to initiate a link simulation. When box 1560 is selected, the link simulation platform may generate eye-diagrams and, in some embodiments, display the optimized settings (e.g., pre-emphasis and equalization settings).

It is understood that the arrangement of FIG. 16 is merely illustrative.

Thus systems and methods for providing behavior models of links and simulating the performance of such links are provided. A person skilled in the art will appreciate that the present invention can be practiced by other than the described embodiments, which are presented for purposes of illustration rather than of limitation, and the present invention is limited only by the claims which follow.

What is claimed is:

1. A method for using a link simulation platform to simulate link performance, the link comprising a transmitter, a transmission medium, and a receiver, the method comprising:
    receiving data defining transmission medium parameters of the transmission medium;
    providing a transmitter behavior model that substantially correlates to the actual behavior of the transmitter;
    providing a receiver behavior model that substantially correlates to the actual behavior of the receiver; and
    simulating link performance using the transmission medium parameters, the transmitter behavior model, and the receiver behavioral model, wherein the transmitter behavioral model incorporates silicon level parameters.

2. The method of claim 1, wherein the transmitter behavioral model comprises a model of transmitter pre-emphasis, wherein the model of transmitter pre-emphasis is modeled using a transfer function of a FIR filter using tap-coefficients extracted from silicon level parameters.

3. The method of claim 1, wherein the transmitter behavioral model is modeled using a transfer function of a multi-pole and multi-zero filter incorporating silicon level parameters.

4. The method of claim 1, wherein the transmitter behavioral model emulates silicon level behavior of the transmitter.

5. The method of claim 1, wherein the receiver behavioral model comprises a model of receiver equalization, wherein the model of receiver equalization is modeled using a transfer function incorporating silicon level parameters.

6. The method of claim 1, wherein the receiver behavioral model incorporates silicon level parameters.

7. The method of claim 1, wherein the receiver behavioral model emulates silicon level behavior of the receiver.

8. The method of claim 1 further comprising displaying at least one eye diagram.

9. The method of claim 1, wherein simulating comprises:
generating a data signal;
applying the data pattern to the transmitter behavioral model to provide a transmitter output data signal;
applying the transmitter output data pattern to the transmission medium parameters to provide a distorted data signal; and
applying the distorted data signal to the receiver behavioral model to provide an equalizer output data signal.

10. The method of claim 9, wherein the transmitter behavioral model comprises adjustable pre-emphasis settings and the receiver behavioral model comprises adjustable equalizer settings, wherein the simulating comprises:
selectively optimizing the pre-emphasis and equalization settings.

11. The method of claim 10 further comprising displaying the optimized pre-emphasis and equalization settings.

12. The method of claim 1 further comprising:
providing a database of behavioral models, wherein at least one behavioral model correlates with an actual product that can be used in an actual link;
allowing a user to select an actual product to be used for link simulation;
receiving a user selection of an actual product; and
selecting a behavioral model correlating to the selected actual product.

13. A method for simulating data transmission over a link, the link comprising a transmitter and a transmission medium, the method comprising:
providing behavioral models of the link, the behavioral models incorporating silicon level parameters which enable the behavioral models to substantially emulate the actual behavior of a portion of the link; and
simulating data transmission over the link using at least one of the behavioral models of the link, wherein the at least one behavioral model comprises a behavioral model of the transmitter.

14. The method of claim 13, wherein the at least one behavioral model comprises a behavioral model of a transmitter with pre-emphasis.

15. The method of claim 13, the link comprising a receiver, wherein one of the behavioral models comprises a behavioral model of a receiver with equalization.

16. The method of claim 13, wherein the silicon level parameters are derived from silicon level simulations of the actual link.

17. The method of claim 13, wherein the silicon level parameters are derived from measurements taken from a silicon level equivalent circuit of at least a portion of the link.

18. The method of claim 13 further comprising receiving s-parameters to define the transmission medium, and wherein the simulating comprises using the s-parameters.

19. The method of claim 13, wherein the transmitter is a transmitter with pre-emphasis settings, the method further comprising determining an optimal pre-emphasis setting.

20. The method of claim 13, wherein the link comprises a receiver with equalization settings, the method further comprising determining an optimal equalization setting.

21. The method of claim 13, further comprising predicting the predict bit-error-ratio of the data transmission over the link.

22. The method of claim 13, wherein the behavioral models comprise a transmitter pre-emphasis model and a receiver equalization model, the simulating comprising performing any one of groups a-d:
a) optimizing parameters for the transmitter pre-emphasis model; and
optimizing parameters for the receiver equalization model;
b) inputting parameters for the transmitter pre-emphasis model; and
inputting parameters for the receiver equalization model;
c) optimizing parameters for the transmitter pre-emphasis model; and
inputting parameters for the receiver equalization model; and
d) inputting parameters for the transmitter pre-emphasis model; and
optimizing parameters for the receiver equalization model.

23. The method of claim 13 further comprising generating a data signal including a user defined data rate and amplitude, the simulating using the data signal.

24. The method of claim 13 wherein the simulating comprises simulating data transmission with cross-talk effects.

25. A system for simulating data transmission over a link, the link comprising a transmitter and a transmission medium, the system comprising user equipment operative to:
provide behavioral models of the link, the behavioral models incorporating silicon level parameters which enable the behavior models to substantially emulate the actual behavior of a portion of the link including at least the transmitter; and
simulate data transmission over the link using at least one of the behavioral models of the link.

26. The system of claim 25, wherein one of the behavioral models comprises a behavioral model of a transmitter with pre-emphasis.

27. The system of claim 25, the link comprising a receiver, wherein one of the behavioral models comprises a behavioral model of a receiver with equalization.

28. The system of claim 25, wherein the silicon level parameters are derived from silicon level simulations of the actual link.

29. The system of claim 25, wherein the silicon level parameters are derived from measurements taken from a silicon level equivalent circuit of at least a portion of the link.

30. The method of claim 25, wherein the user equipment is operative to receive s-parameters to define the transmission medium, and wherein the simulating comprises using the s-parameters.

31. The system of claim 25, wherein the transmitter is a transmitter with pre-emphasis settings, the user equipment operative to determine an optimal pre-emphasis setting.

32. The system of claim 25, wherein the link comprises a receiver with equalization settings, the user equipment operative to determine an optimal equalization setting.

33. The system of claim 25, the user equipment operative to predict the predict bit-error-ratio of the data transmission over the link.

* * * * *